(12) United States Patent
Suh et al.

(10) Patent No.: US 9,747,391 B2
(45) Date of Patent: Aug. 29, 2017

(54) METHOD AND DEVICE FOR DESIGNING A CURRENT SUPPLY AND COLLECTION DEVICE FOR A TRANSPORTATION SYSTEM USING AN ELECTRIC VEHICLE

(75) Inventors: Nam Pyo Suh, Daejeon (KR); Dong Ho Cho, Seoul (KR); Chun Taek Rim, Daejeon (KR); Seong Jeub Jeon, Pusan (KR); Jung-Ho Kim, Daejeon (KR); Seung-Young Ahn, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 149 days.

(21) Appl. No.: 13/810,066

(22) PCT Filed: Feb. 9, 2011

(86) PCT No.: PCT/KR2011/000867
§ 371 (c)(1),
(2), (4) Date: Apr. 25, 2013

(87) PCT Pub. No.: WO2012/008672
PCT Pub. Date: Jan. 19, 2012

(65) Prior Publication Data
US 2013/0304443 A1   Nov. 14, 2013

(30) Foreign Application Priority Data
Jul. 15, 2010 (KR) .................. 10-2010-0068470

(51) Int. Cl.
*G06G 7/48* (2006.01)
*G06F 17/50* (2006.01)
(Continued)

(52) U.S. Cl.
CPC .............. *G06F 17/50* (2013.01); *B60L 5/005* (2013.01); *B60L 11/182* (2013.01); *B60M 7/003* (2013.01);
(Continued)

(58) Field of Classification Search
CPC ......... G06F 17/50; B60M 7/003; B60L 5/005; B60L 11/182; B60L 2200/26;
(Continued)

(56) References Cited

U.S. PATENT DOCUMENTS

| 2004/0236551 | A1 | 11/2004 | Kobayashi et al. |
| 2009/0045773 | A1* | 2/2009 | Pandya et al. ................ 320/108 |
| 2012/0186927 | A1 | 7/2012 | Suh et al. |

FOREIGN PATENT DOCUMENTS

| JP | 2000-092615 A | 3/2000 |
| JP | 2003-189508 A | 7/2003 |
| KR | 10-0944113 B1 | 2/2010 |

OTHER PUBLICATIONS

International Search Report for International Application No. PCT/KR2011/000867 mailed Oct. 6, 2011.

* cited by examiner

*Primary Examiner* — Saif Alhija
(74) *Attorney, Agent, or Firm* — Lex IP Meister, PLLC

(57) ABSTRACT

Provided is a method for designing a current supply device for wirelessly supplying power to a vehicle having a current collection device. In the design method, the gap between the two adjacent magnetic poles of the current supply device is received as input and then the gap between the current supply device and the current collection device is determined based on the gap between the two magnetic poles. Next, the magnitude of the power to be supplied to the current supply device is determined based on the value required with respect to the magnitude of the magnetic field (Continued)

and the gap between the current supply device and the current collection device. According to the design method, current supply device can easily be designed since various functional requirements are decoupled from each other.

20 Claims, 6 Drawing Sheets

(51) Int. Cl.
*B60L 5/00* (2006.01)
*B60L 11/18* (2006.01)
*H02J 5/00* (2016.01)
*B60M 7/00* (2006.01)

(52) U.S. Cl.
CPC ........... *H02J 5/005* (2013.01); *B60L 2200/26* (2013.01); *B60L 2250/16* (2013.01); *B60L 2270/147* (2013.01); *Y02T 10/7005* (2013.01); *Y02T 10/7072* (2013.01); *Y02T 90/122* (2013.01); *Y02T 90/14* (2013.01)

(58) Field of Classification Search
CPC   B60L 2270/147; B60L 2250/16; H02J 5/005; Y02T 10/7005; Y02T 10/7072; Y02T 90/14; Y02T 90/122
USPC ............................................................ 703/8
See application file for complete search history.

[Fig. 1]
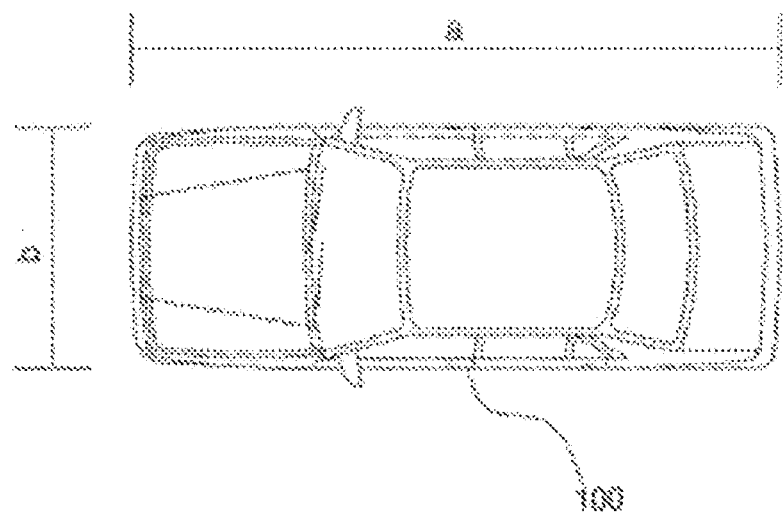

[Fig. 2]
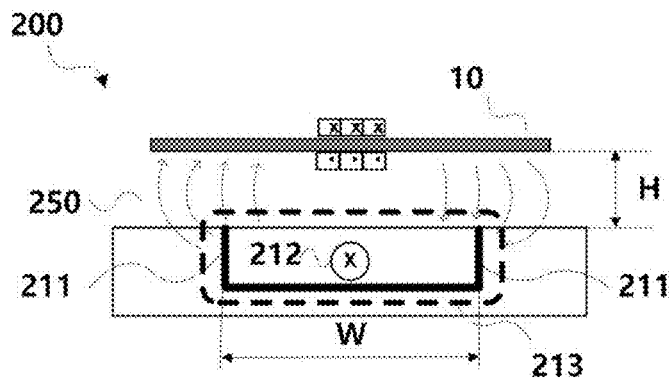
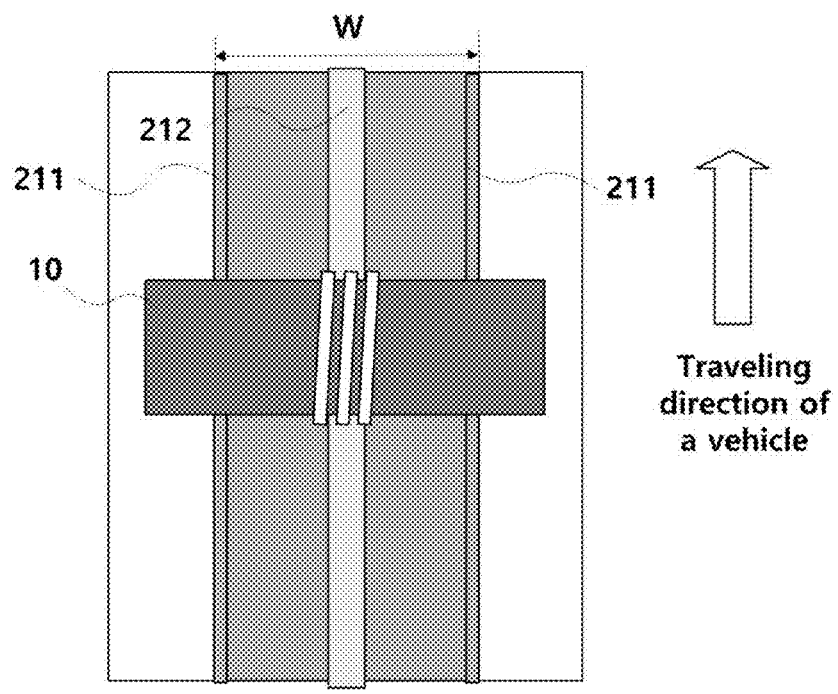
Traveling direction of a vehicle

[Fig. 3]
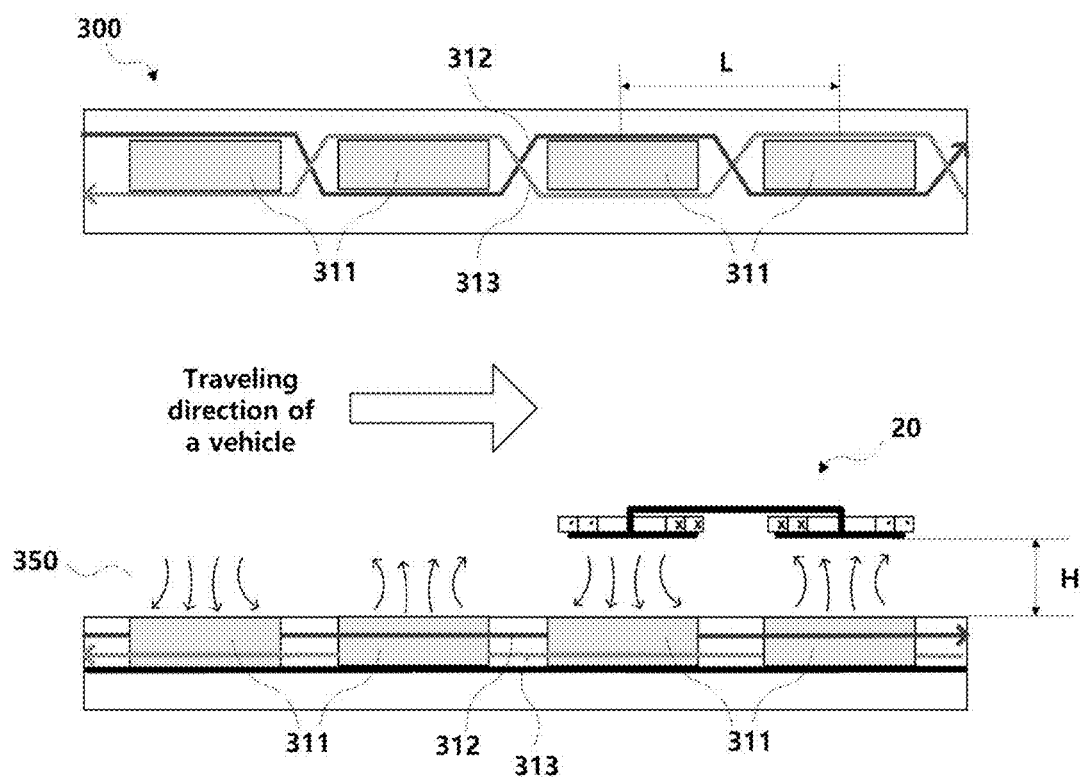

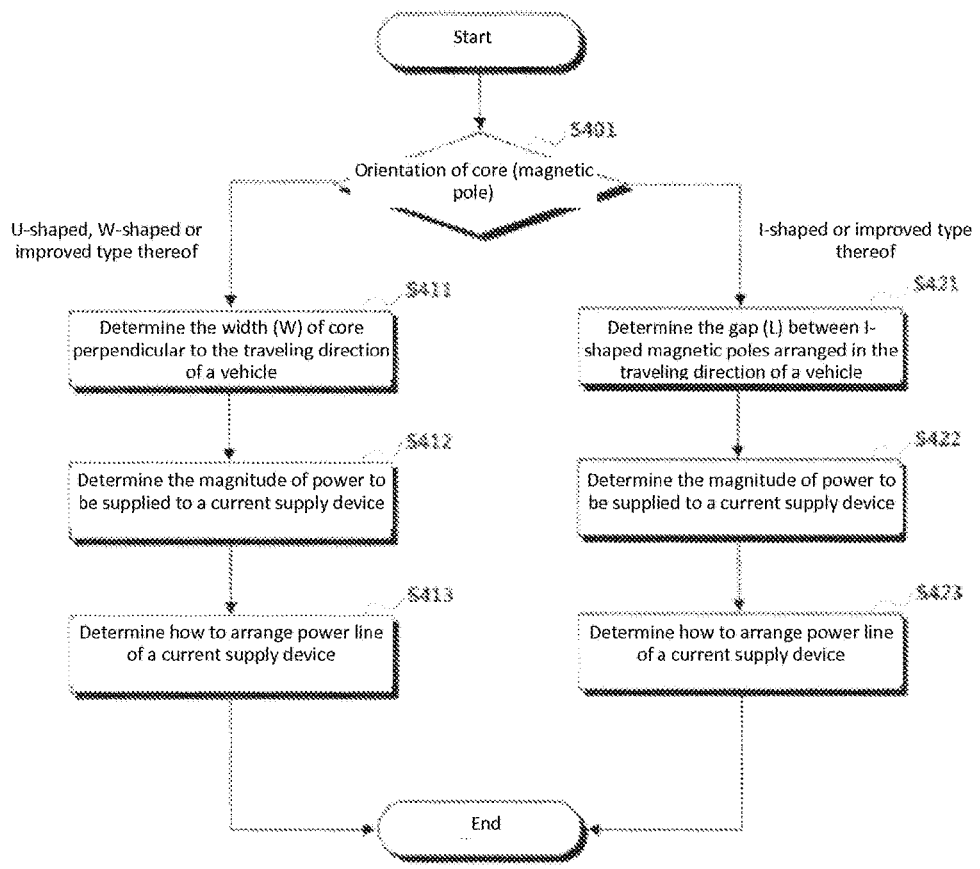
[Fig. 4]

[Fig. 5]
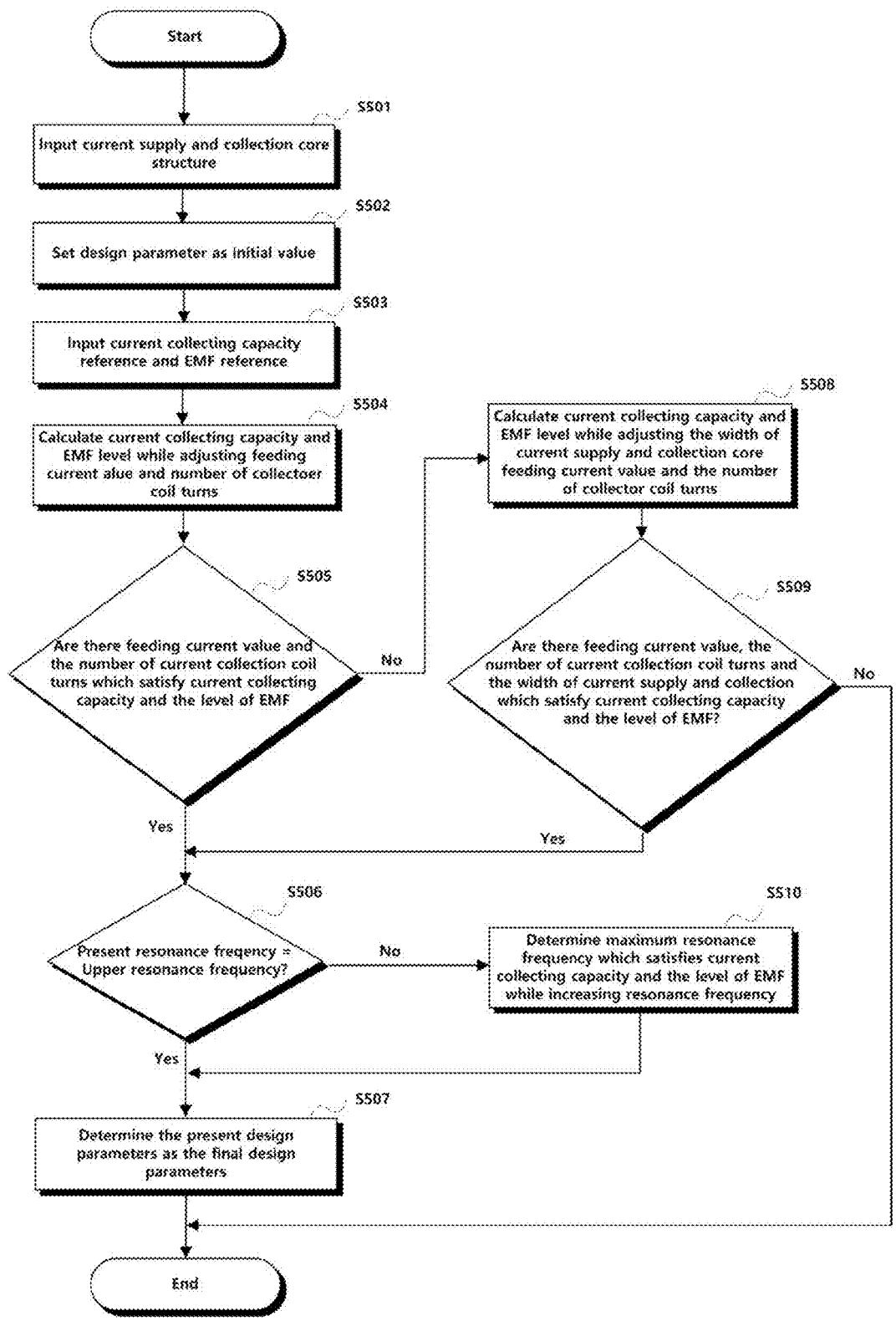

[Fig. 6]
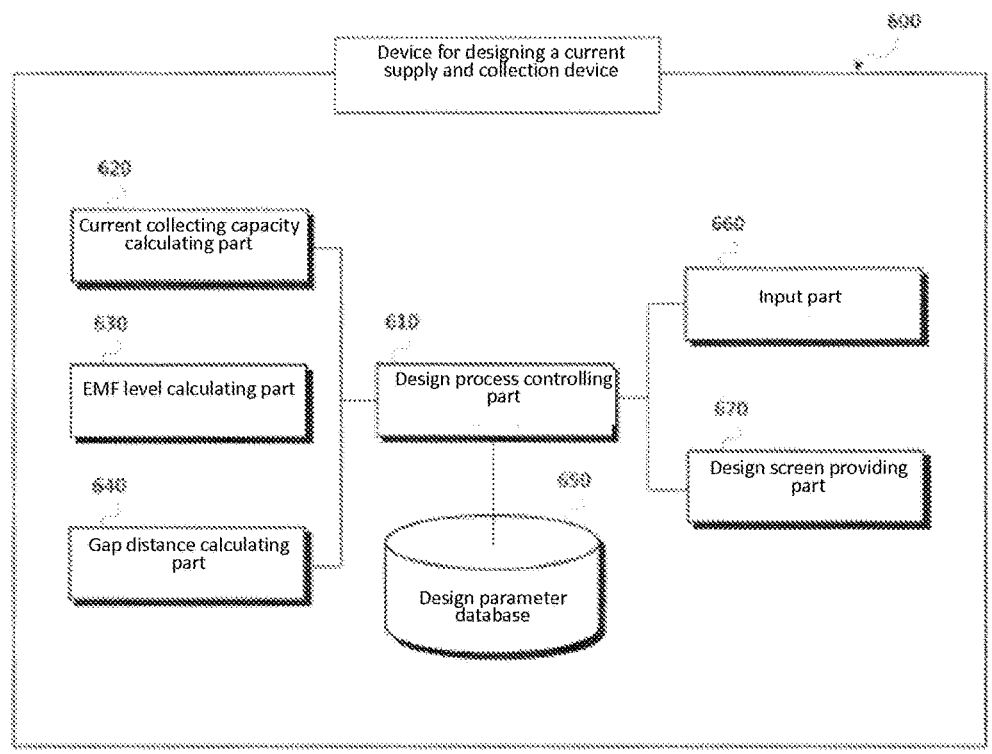

METHOD AND DEVICE FOR DESIGNING A CURRENT SUPPLY AND COLLECTION DEVICE FOR A TRANSPORTATION SYSTEM USING AN ELECTRIC VEHICLE

CROSS REFERENCE TO RELATED APPLICATIONS

This application is a national stage application under 35 U.S.C. §371 of International Application No. PCT/KR2011/000867. filed Feb. 9, 2011 and entitled "METHOD AND DEVICE FOR DESIGNING A CURRENT SUPPLY AND COLLECTION DEVICE FOR A TRANSPORTATION SYSTEM USING AN ELECTRIC VEHICLE." which claims the benefit of Korean Application No. KR 10-2010-0068470, filed Jul. 15, 2010, the contents of both of which are incorporated herein by reference to the maximum extent allowable under the law.

TECHNICAL FIELD

The present invention relates to methods and devices for designing a current supply and collection device for a transportation system using an electric vehicle, and more specifically to the method and device for designing a current supply device for a transportation system using an electric vehicle which can drive using power supplied from the outside while charging its battery and a current collection device which is installed in the vehicle.

DESCRIPTION OF RELATED ART

The existing internal combustion engine vehicle is driven using fossil fuel. In this case emission exhausted to the outside of a vehicle after combustion in the engine causes environmental problems such as air pollution or global warming. To solve these problems, studies have been made for vehicles which use alternative energy including electricity charged in battery, hydrogen-oxygen fuel cell, and solar heat. Among them, vehicles using electricity charged in battery have partly been put to practical use.

The challenge with battery-powered vehicles is that the capacity of batteries currently put to practical use is not sufficient enough to allow for long travel. For example, for practical use, a battery-powered vehicle in the domestic environment should be able to travel from Seoul to Busan, about a 400 km-distance, with a single charge. However, in order to drive this mileage using the existing technology, the weight of the battery increases and the efficiency of the electric vehicle decreases. Also, an internal combustion engine vehicle can stop by a filling station to refuel but a battery-powered vehicle needs a long time to recharge its battery and is difficult to refuel in as short a time as the internal combustion engine vehicle In this context, the present applicant's U.S. Pat. No. 940,240 shows a transportation system using a vehicle powered by a current supply device which is installed on the road. The online electric vehicle (OLEV) described in that document receives power from a current supply device installed in the basement and uses power to operate the motor which drives the wheels. When the OLEV drives the road where a current supply device is installed, it uses power supplied by the current supply device; when it drives the road where a current supply device is not installed, it uses battery power. Also, the supplied power can be used to recharge the battery of the OLEV. Accordingly, efficiency increases as there is no need to install a heavy high-capacity battery for long-distance travel, and a vehicle does not need to stop for a long time to recharge its batteries as the battery is charged when traveling on the road where a current supply device is installed.

With respect to a current supply device which supplies power to OLEV, there is the same type as the W-shaped and I-shaped devices published on the present applicant's patent application No. 10-2009-0067715 and No. 10-2009-0091802, respectively. As published in patent application No. 10-2009-0067715, for W-shaped or the dual-rail current supply device, magnetic poles lie in the traveling direction of a vehicle, that is, perpendicular to the extension direction of the road, and a feeding line is extended in the traveling direction of the vehicle. On the contrary, for an I-shaped current supply device, magnetic poles lie in the traveling direction of a vehicle. Apart from the aforementioned two kinds, U-shaped or mono-rail current supply devices can be implemented. The difference between a W-shaped and a U-shaped current supply device is that a W-shaped device has magnetic poles lying at both sides and the center and a U-shaped device has magnetic poles only lying at both sides.

BRIEF SUMMARY OF THE INVENTION

Technical Task

The present invention was invented to provide a method and device for designing the abovementioned various types of current supply and collection device in a systematic and easy manner.

Means to Solve the Task

In order to obtain the abovementioned goal, a method for designing a current supply device for wirelessly supplying power to a vehicle having a current collection device consists of (a) a step where the gap between the current supply device and the current collection device is received as input; (b) a step where the width of current supply and collection core or the gap between two adjacent magnetic poles is determined based on said gap between the current supply device and the current collection device; (c) a step where the value required with respect to the magnitude of the magnetic field generated from the current supply device is received as input; and (d) the magnitude of the power to be supplied to the current supply device is determined based on the width of current supply and the collection core or gap between the two adjacent magnetic poles determined at said step (b) and said value required with respect to the magnitude of the magnetic field.

A step where the method of mounting the feeding line which supplies power to the current supply device is determined (d1) may be included after said step (d).

A step where the orientation of magnetic poles of a current supply device is received as input may be included before said step (a).

For the orientation of magnetic poles of a current supply device, more than two magnetic poles may run in parallel with the traveling direction of a vehicle and are aligned with each other.

For the orientation of magnetic poles of a current supply device, multiple magnetic poles may be arranged in series in the traveling direction of a vehicle.

A step where active or passive shield type for EMF generated from a current supply and a current collection device (d2) is determined may be included after said step (d).

A step where on/off conditions of the switch of a current supply device (d3) is determined may be included after said step (d).

A step where the resonance of a current collection device mounted in a vehicle at the frequency of the AC magnetic field generated from a current supply device (d4) is determined may be included after said step (d).

According to another aspect of the present invention, a method for designing a current supply and collection device for wirelessly supplying power to a vehicle having a current collection device by generating a magnetic field consists of (a) a step where design parameters including resonance frequency, feeding current values, the width of a current supply and collection core, and the number of collector coil turns are set as initial values; (b) a step where a minimum current collecting capacity required for a current collection device ('current collecting capacity reference') and maximum EMF value allowable from a current supply and collection device ('EMF reference') are received as input; (c) a step where current collecting capacity and the level of EMF are calculated using the present design parameters; (d) a step where if the calculated current collecting capacity is below said current collecting capacity reference or the level of the EMF is above the said EMF reference ("design conditions dissatisfied"), calculation of current collecting capacity and the level of EMF is repeated while adjusting feeding current values among the set design parameters; and (e) a step where if there is a feeding current value which makes the calculated current collecting capacity above the said current collecting capacity reference or the level of the EMF below the said EMF reference ("design conditions satisfied"), such feeding current values and other design parameter values are determined as the final design parameters.

For said step (e), if there is feeding current value which satisfies design conditions, before determining the present design parameter values as the final design parameters, (e11) a step where if the present resonance frequency is below the maximum resonance frequency in a permissible range ('upper resonance frequency'), maximum resonance frequency which satisfies design conditions is found by increasing the resonance frequency among said design parameters in the range below said upper resonance frequency and repeating the calculation of the current collecting capacity and the level of the EMF may be included, and then (e12) a step where the maximum resonance frequency found in said step (e11), the feeding current value of said step (e), and other present design parameter values are determined as the final design parameters may be included.

For said step (e), if there is no feeding current value which satisfies design conditions, before determining the present design parameter values as the final design parameters, (e21) a step where calculation of current collecting capacity and the level of EMF is repeated while the width of current supply and collection core or the gap between magnetic poles (commonly called 'the width of current supply and collection core') in a permissible range is increased and feeding current value is adjusted; (e22) a step where if the width of current supply and collection core and feeding current value which satisfy design conditions do not exist, design process for a current supply device ends, and if they exist, the next step (e23) is followed; (e23) a step where if the present resonance frequency is below maximum resonance frequency in a permissible range ('upper resonance frequency'), maximum resonance frequency satisfying design condition is found by increasing resonance frequency among said design parameters in the range below said upper resonance frequency and repeating calculation of current collecting capacity and the level of EMF is included, and then (e24) a step where the maximum resonance frequency found in said step (e23), the feeding current value of said step (e22), and other present design parameter values are determined as the final design parameters may be included.

For said step (d), the number of collector coil turns is included in design parameters to be adjusted, and for said step (e), the number of collector coil turns is included in design parameters which are determined as the final design parameters if they exist.

It is desirable to set the value of said resonance frequency higher than maximum audio frequency value.

Decision of whether design conditions are satisfied includes decision of whether the gap between the current supply device and the current collection device is more than the minimum gap which has already been set.

According to another aspect of the present invention, a method for designing a current supply device for wirelessly supplying power to a vehicle having a current collection device by generating magnetic field consists of (a) a step where the core structure type of a current supply and collection device which will determine design parameters including resonance frequency, feeding current value, the width of current supply and collection core, and the number of collector coil turns is received as input; (b) a step where said design parameters are set to initial values; (c) a step where minimum current collecting capacity required for a current collection device ('current collecting capacity reference') and maximum EMF allowable from a current supply and collection device are received as input; (d) a step where current collecting capacity and the level of EMF are calculated using the present design parameters; (e) a step where if the calculated current collecting capacity is below said current collecting capacity reference or the level of EMF is above said EMF reference ("design conditions dissatisfied"), calculation of current collecting capacity and the level of EMF is repeated while feeding current value among the present design parameters is adjusted; and (f) a step where if there is feeding current value which makes the calculated current collecting capacity above said current collecting capacity reference and the level of EMF below said EMF reference ("design conditions satisfied"), such feeding current value and other present design parameter values are determined as the final design parameters for said core structure type.

For said step (a), if more than two core structure types are received as input, said steps (b) through (f) may be carried out sequentially for each of the core structure types.

For said step (f), if there is feeding current value which satisfies design conditions, before determining the present design parameter values as the final design parameters, (f11) a step where if the present resonance frequency is below maximum resonance frequency in a permissible range ('upper resonance frequency'), maximum resonance frequency which satisfies design conditions is found by increasing resonance frequency among said design parameters in the range below said upper resonance frequency and repeating calculation of current collecting capacity and the level of EMF may be included, and then (f12) a step where the maximum resonance frequency found in said step (f11), the feeding current value of said step (f), and other present design parameter values are determined as the final design parameters may be included.

For said step (f), if there is no feeding current value which satisfies design conditions, before determining the present design parameter values as the final design parameters, (f21)

a step where calculation of current collecting capacity and the level of EMF is repeated while the width of current supply and collection core or the gap between magnetic poles (commonly called 'the width of current supply and collection core) is increased in a permissible range and feeding current value is adjusted; (f22) a step where if the width of current supply and collection core and feeding current value which satisfy design conditions do not exist, design process for a current supply device ends, and if they exist, the next step (f23) is followed; and (f23) a step where if the present resonance frequency is below maximum resonance frequency in a permissible range ('upper resonance frequency'), maximum resonance frequency which satisfies design conditions is found while resonance frequency among said design parameters is increased in the range below said upper resonance frequency and calculation of current collecting capacity and the level of EMF is repeated may be included, and then (f24) a step where the maximum resonance frequency found in said step (f23), the feeding current value of said step (f22), and other present design parameter values are determined as the final design parameters may be included.

For said step (e), design parameters to be adjusted may include the number of collector coil turns, and for said step (f), design parameters of which existence is determined and which are determined as the final design parameters may include the number of collector coil turns.

It is desirable to set said resonance frequency higher than maximum audio frequency.

Decision of whether said design conditions are satisfied may include decision whether the gap between a current supply device and a current collection device is more than the minimum gap which has already been set.

According to another aspect of the present invention, a device for designing a current supply device for wirelessly supplying power to a vehicle having a current collection device by generating magnetic field consists of a current collecting capacity calculating part which calculates the current collecting capacity from design parameters including resonance frequency, feeding current value, the width of current supply and collection core and the number of collector coil turns; an EMF level calculating part which calculates the level of EMF using said design parameters; a design parameter database which saves said design parameter values and parameter range values of said design parameters; an input part which input design condition reference including said design parameter values, parameter range values of said design parameters, current collecting capacity and the level of EMF being requested; a design screen providing part which displays every kind of data in design process including data calculated from the design process, design condition reference and the determined design parameter values; and a design process controlling part which calculates the current collecting capacity and the level of EMF according to the change of each design parameter and the determination of design parameters by controlling said components so as to design a current supply and collection device which satisfies the current collecting capacity and the level of EMF in the set range.

Said design parameters may include said current supply and collection core structure type.

Said design condition reference may include the minimum gap between a current supply device and a current collection device.

Said device for designing a current supply and collection device may include a gap calculating part which calculates the gap between a current supply device and a current collection device using said design parameters.

Effect of the Invention

A method for designing OLEV according to the present invention has an effect to easily design current supply device can easily be designed since various functional requirements are decoupled from each other.

In addition, a method for designing according to the present invention has an effect of optimal designing various current supply and collection devices.

BRIEF DESCRIPTION OF THE SEVERAL VIEW OF THE DRAWING

FIG. 1 shows the length direction and the width direction of OLEV.

FIG. 2 shows a U-shaped current supply device schematically.

FIG. 3 shows an I-shaped current supply device schematically.

FIG. 4 shows a flow chart of method for designing a current supply device according to the axiomatic design theory.

FIG. 5 shows a flow chart which shows optimal design for a current supply and collection device.

FIG. 6 shows a device for designing a current supply and collection device which supplies and collects electric power magnetic induction.

LEGEND

100: Online electric vehicle
20: Current collection device
200: U-shaped current supply device
211: Core (magnetic pole) of a U-shaped current supply device
212: Feeding line of a U-shaped current supply device
213: Cross section of a U-shaped current supply core
300: I-shaped current supply device
311: Core (magnetic pole) of an I-shaped current supply device
312, 313: Feeding line of an I-shaped current supply device
250, 350: Magnetic field generated by a current supply device
600: Device for designing a current supply device
610: Design process controlling part
620: Current collecting capacity calculating part
630: EMF level calculating part
640: Gap distance calculating part
650: Design parameter database
660: Input part
670: Design screen supply part

THE BEST FORM FOR EMBODIMENT OF THE INVENTION

From now on, a desirable embodiment of the present invention will be described in detail on reference to the attached drawings. Prior to this, the terms or words used in the present specifications and claims should not be limited to usual or dictionary meanings but be interpreted in such meanings and concepts that correspond to the technical idea of the present invention based on a principle that the inventor can properly define the concepts of the terms to explain his invention in the best way. Therefore, the configurations illustrated in the embodiments and drawings of the present specifications are merely the most desirable embodiments of the present invention and do not represent all the technical ideas of the present invention, and it should be understood that there could be various equal things and varied examples which can replace such configurations at the time of the present application.

In relation to method for designing according to the present invention, design parameters of a transportation system which uses online electric vehicle (OLEV) may be determined based on the axiomatic design theory as follows:

The functional requirements (FR) of a transportation system are as follows:

FR1=Propel the vehicle with electric power.
FR2=Transfer electricity from underground electric cable to the vehicle.
FR3=Steer the vehicle.
FR4=Brake the vehicle.
FR5=Reverse the direction of motion.
FR6=Change the vehicle speed.
FR7=Provide the electric power when there is no external electric power supply.
FR8=Supply electric power to the underground cable.

The constraints (C) of a transportation system are as follows:

C1=Safety regulations governing electric system
C2=Price of OLEV (should be competitive with cars with IC engines)
C3=No emission of greenhouse gases
C4=Long-term durability and reliability of the system
C5=Vehicle regulation for space clearance between the road and the bottom of the vehicle The design parameters (DP) of a transportation system, which satisfy the abovementioned FRs and Cs are as follows:

DP1=Electric motor
DP2=Underground coil
DP3=Conventional steering system
DP4=Conventional braking system
DP5=Electric polarity
DP6=Motor drive
DP7=Re-chargeable battery
DP8=Electric power supply system The number of the abovementioned FRs and DPs of a given transporation system is 8, respectively. And a design matrix is uncoupled. However, these FRs and DPs should be decomposed until detail design is completed.

The present invention provides method for designing the current supply device which is used by transporation system, by decomposing the second FR (hereinafter referred to as "FR2") and the second design parameter (DP2) of the aforementioned transportation system. FR2 and DP2 can be written again as follows:

FR2=Transfer electricity from underground cable to the vehicle.
DP2=Underground coil The abovementioned FR2 and DP2 can not be implemented as they are because no concrete design concept is given. Therefore, a lower level of FR and DP should be considered so as to understand a whole concept of OLEV. From now on, by decomposing down to lower level, 1) how to deliver electricity towards over the ground and 2) how to adjust maximum height of the current collection device, that is, how to adjust the gap between the ground and the current collection device installed in the vehicle will be examined.

FR2 can be decomposed as follows:

FR21=Generate an alternating magnetic field.
FR22=Control the power level of the magnetic field.
FR23=Shape the magnetic field to control the height of the field, H.
FR24=Control the radiation of EMF.
FR25=On/Off the magnetic field.
FR26=Maximize the pick-up of the power in the alternating magnetic field created under the ground for use in the vehicle.

There can be different methods to meet the abovementioned functional requirements. In order to embody uncoupled design, the present invention selects design parameters as follows:

DP21=Underground power lines with AC field surrounding the magnetic core (ferrite)
DP22=Electric power level, i.e., current (I) times voltage (V)
DP23=Width of the magnetic poles established by the magnetic core in the ground
DP24=Active or passive shield for EMF
DP25=Switch that turn on/off the underground power
DP26=Pick-up unit mounted on the car that resonates the frequency of the alternating magnetic field When functional requirements and design parameters are set as abovementioned, a design matrix is given as follows:

$$\begin{pmatrix} FR21 \\ FR22 \\ FR23 \\ FR24 \\ FR25 \\ FR26 \end{pmatrix} = \begin{pmatrix} A11 & A12 & A13 & 0 & 0 & 0 \\ 0 & A22 & A23 & 0 & 0 & 0 \\ 0 & 0 & A33 & 0 & 0 & 0 \\ 0 & 0 & 0 & A44 & 0 & 0 \\ 0 & 0 & 0 & 0 & A55 & 0 \\ 0 & 0 & 0 & 0 & 0 & A66 \end{pmatrix} \begin{pmatrix} DP21 \\ DP22 \\ DP23 \\ DP24 \\ DP25 \\ DP26 \end{pmatrix}$$

Mathematical expression 1

In the above expression, A11, A12, etc. are given as a constant (for linear system) or a function of design parameter (for non-linear system) and shows the relation between functional requirement and design parameter. As we can know from the mathematical expression 1, FR21 is related to DP21, DP22 and DP23, FR22 is related to DP22 and DP23, and FR23 is related to only DP23.

From the mathematical expression 1, it can be known that the design according to the present invention is a decoupled design. It also can be known that the relation between function requirements {FR24, FR25, and FR26} and design parameters {DP24, DP25, and DP26} is uncoupled.

The relation between function requirements {FR21, FR22, and FR23} and design parameters {DP21, DP22, and DP23} is a triangular matrix, which means it is a decoupled design. In this kind of decoupled design, DP23 shall be first determined, followed by DP22 and DP21, thereby the value of each of the functional requirements (FR21, FR22, and FR23) shall be set. That is, each of the functional requirements may be determined in order as follows:

$FR23 = A33 \cdot DP23$ $FR22 = A22 \cdot DP22 + A23 \cdot DP23$ $FR21 = A11 \cdot DP21 + A12 \cdot DP22 + A13 \cdot DP23$ Mathematical expression 2

If the order stated in the mathematical expression 2 is not followed, functional requirements can not be independently determined. As FR24 and FR25 are uncoupled with each other, they can be determined independently as follows:

$$FR24 = A44 \cdot DP24$$

$$FR25 = A55 \cdot DP25$$

$$FR26 = A66 \cdot DP26 \qquad \text{Mathematical expression 3}$$

From now on, the abovementioned method for designing will be elaborated in reference to drawings 1 through 3 for the embodiments applied to method for designing a U-shaped current supply device and an I-shaped current supply device, respectively. In drawing 1, a and b indicate the length and the width of a vehicle, respectively, and in drawings 2 and 3, W and L indicate the width of core (magnetic pole) of a U-shaped current supply device and the gap between cores of an I-shaped current supply device.

For a U-shaped current supply device, the gap (H) between the ground and the current collection device can be adjusted by setting the width (W) of the core. Put it differently, it can be expressed as follows: FR23=H=(constant)×f(W), where f(W) refers to a function of the width (W) of a core. In order to satisfy FR22, that is, to control the level of magnetic force of the magnetic field, the level of power, that is, current and voltage shall be set. For example, when voltage is determined, you can set current. FR21 can be controlled by DP21 while being affected by DP22 and DP23. For example, the number of cables installed underground in the traveling direction of a vehicle can be set as DP21.

When applying what is abovementioned to the mathematical expression 1, we can get the following relation:

$$FR23 = A33 \cdot DP23 = A33 \times f(W) \qquad \text{Mathematical expression 4}$$

$$FR22 = A22 \cdot DP22 + A23 \cdot DP23$$
$$= A22 \cdot I \cdot V + A23 \times f(W)$$

$$FR21 = A11 \cdot DP21 + A12 \cdot DP22 + A13 \cdot DP23$$
$$= A11 \cdot \text{electromagnet degisn} | A12 \cdot I \cdot V | A13 \times f(W)$$

For an I-shaped current supply device, the same relation as a U-shaped current supply device is applied, provided that in this case FR23 is expressed as a function of the gap (L) of core for the traveling direction of a vehicle.

An I-shaped current supply device has the following advantages by cores (magnetic poles) arranged in the traveling direction of a vehicle.

1) Because the length (a) of a vehicle is larger than the width (b) of it, using an I-shaped current supply device enables to set the gap between magnetic poles larger in the length direction of the vehicle, that is, the traveling direction of the vehicle. Also, the larger the gap between magnetic poles, the larger the gap (H) between current supply devices is.

2) By arranging magnetic poles in the traveling direction of a vehicle, a narrow magnetic field can be generated for the width direction of the vehicle. Accordingly, magnetic field shield in the width direction of the vehicle becomes has advantage.

3) By arranging more than one I-shaped current supply device in the width direction of a vehicle and providing multiple magnetic fields simulatenously generated in the direction, power transmission can be increased.

4) By introducing phase lag between cables arranged in the traveling direction of a vehicle and leveling the profile of magnetic field, power transmission efficiency can be improved.

From now on, a method for designing a current supply device for wirelessly supplying power to a vehicle having a current collection device will be explained based on the abovementioned.

Drawing 4 is a flow chart which shows method for designing a current supply device according to the axiomatic design theory First, the form of a current supply device is received as input. That is, selection among U-shaped, W-shaped, I-shaped current supply device or improved type thereeof in various ways is received as input (S401).

A U-shaped device is a current supply core structure illustrated in drawing 2, which extends in parallel with the traveling direction of a vehicle and has more than two magnetic poles (211) aligned with each other. It is called a U-shaped because the cross section (213) of a core perpendicular to the traveling direction of a vehicle is U-shaped.

An I-shaped device is a current supply core structure illustrated in drawing 3. Multiple magnetic poles (311) arranged in series in the traveling direction of a vehicle are arranged so as to form one or more rows in series in the traveling direction of a vehicle. The name of 'I-shaped' is originated from the T-shaped cross section of a magnetic pole perpendicular to the traveling direction of a vehicle.

A W-shaped device is in a similar structure with a U-shaped current supply core closely arranged in parallel with the traveling direction of a vehicle. Accordingly, it is called a W-shaped because the cross section of a magnetic pole perpendicular to the traveling direction of a vehicle (transverse) is W-shaped.

Besides, various shapes of core structure type exist which partly changed and improved the abovementioned I-shaped, U-shaped and W-shaped cores.

When the shape of a current supply device is determined, the gap (H) between the current supply device and the current collection device (see drawings 2 and 3) is also input. The current supply device is installed underground and the upper stage of the core almost corresponds to the ground, so the gap between the ground and the current collection device is received as input. Next, the gap between two adjacent magnetic poles (S411, S421) of the current supply device is determined based on the gap between the current supply device and the current collection device. For U-shaped, W-shaped current supply device or improved type thereof, the width (W) of a core (magnetic pole) (see drawing 2) perpendicular to the traveling direction of a vehicle, that is transverse direction in looking at the front of the road, is determined (S411). For I-shaped current supply device or improved type thereof, the gap (L) between I-shaped cores (magnetic poles) (see drawing 3) arranged in series in the traveling direction of a vehicle (S421).

When the gap between the current supply device and the current collection device is determined, a value required for the magnitude of the magnetic field generated by the current supply device is received as input. The magnitude of the magnetic field is determined taking power necessary to transport a vehicle and power transmission efficiency between the current supply device and the current collection device into account. Next, the magnitude of power to be supplied to the current supply device is determined based on the gap between the current supply device and the current collection device and the magnitude of magnetic field (S412, S422). For example, if the magnitude of voltage has been determined, the magnitude of current to be supplied shall be determined.

After that, a step which determines how to arrange cables to supply power to the current supply device may be included. For example, the diameter and the number of power lines can be determined (S413, S423).

The abovementioned design method according to the axiomatic design theory has decoupled or uncoupled relation between functional requirement and design parameter and enables to easily design a current supply device of OLEV.

From now on, optimal design for OLEV derived from the abovementioned design method according to the axiomatic design theory is explained.

Drawing 5 is a flow chart which shows optimal design for a current supply and collection device. The purpose of optimal design is to maximize current collecting capacity. When $P_c$ is current collecting capacity and $V_c$ is current collecting voltage, $P_c$ is proportional to squared $V_c$. That is, $$P_c \propto V_c^2$$

can be written.

If current collecting voltage is expressed in the functions of related parameters, it can be written as follows:

$$V_c = F(f_r, I_s, N_1, N_2, g_{air}, W_c, S_c, C_c)$$

where each parameter refers to resonance frequency $f_r$, feeding current $I_s$, primary (current supply device) coil turns $N_1$, secondary (current collection device) coil turns $N_2$, the gap between the current supply device and the current collection device $g_{air}$, the width of current supply and collection core $W_c$ (for I-shaped core, the gap between magnetic poles), the structure of a current supply and collection core $S_c$ (U-shaped, W-shaped, I-shaped or improved type thereof) and the characteristics of a current supply and collection core materials $C_c$ (permeability, frequency characteristic). $V_c$ is proportional to the following expression:

$$V_c \propto \frac{f_r I_s N_2 W_c}{N_1 g_{air}}$$

At the same time, another purpose of optimal design is to maximize collection efficiency.

Efficiency E can be written as follows:

$$E = \frac{\text{Regulator Output Power}}{\text{Supply Inverter Input Power}} =$$

$$\frac{\text{Collection Power Capacity}}{\text{Feeding Line Power Capacity}} = \frac{P_c}{P_s} = \frac{\frac{V_c^2}{R_c}}{I_s^2 R_s} = \frac{V_c^2}{R_c I_s^2 R_s}$$

where $R_c$ is collection resistance and $R_s$ is feeding line resistance (feeding line effective section, resonance frequency function, the length of line, conductivity).

For designing a current supply device, the gap $g_{air}$ is proportionate to the following formula.

$$g_{air} = F\left(f_r, I_s, \frac{N_2}{N_1}, W_c, S_c, C_c\right) \propto f_r I_s \frac{N_2}{N_1} W_c$$

It is desirable that $g_{air}$ is more than 12 cm for passenger car and 20 cm for full-size car such as bus.

At the same time, the level of EMF generated should be less than a certain value. That is, if the level of EMF generated is $L_{emf}$, then $$L_{emf} = F\left(f_r, I_g, \frac{N_2}{N_1}, W_c, S_c C_c, g_{air}\right) \propto f_r I_s \frac{N_2}{N_1}, W_c \cdot g_{air}$$

can be written, and it is desirable to satisfy maximum $L_{em} < 62.5$ mG (passive, LC resonance coil type, active shield) at a random point.

In reference to drawing 5, first, core structure type of a current supply and collection device to determine design parameters including resonance frequency, feeding current value, the width of current supply and collection core and the number of collector coil turns (S501). For the type of supply core structure, I-shaped, U-shaped, W-shaped or improved type by partly modifying the aforementioned shape is available. The type of these supply core structure is abovementioned in reference to drawings 2 through 4.

Set the abovementioned design parameters as initial value (S502). Apart from the abovementioned parameters, various parameters can be included in design parameters. Then, input the minimum current collecting capacity value required for a current collection device ('current collecting capacity reference') and the maximum EMF value allowable for a current supply and collection device ('EMF reference') (S503). The values to be input may include the minimum gap between a current supply device and a current collection device.

Calculate the current collecting capacity and the level of EMF from the present design parameters, and if the calculated current collecting capacity is below said current collecting capacity reference or above said EMF reference ("design conditions dissatisfied"), adjust feeding current value among the set design parameters and calculate again the current collecting capacity and the level of EMF (S504). The number of collector coil turns can be included in the design parameters to be adjusted.

Decide whether there is feeding current value which makes the calculated current collecting capacity more than said current collecting capacity reference and the level of EMF less than said EMF reference ("design conditions satisfied") (S505). In this case, it can also be decided whether there is the number of collector coil turns which satisfies such conditions (S505). Also, although it is not illustrated in the flow chart of drawing 5, decision of whether the gap between a current supply device and a current collection device is more than the minimum gap which has been already set could be included in the decision of whether design conditions are satisfied, which may also be applied to cases of deciding whether all the following design conditions are satisfied. For example, the minimum gap can be set to 12 cm for passenger car and 20 cm for full-size car such as bus.

If such values exist, feeding current value, the number of collector coil turns and other present design parameters can be the final design parameters for said core structure type (S507). Or before decision, if the present resonance frequency among design parameters is less than maximum resonance frequency in a permissible range ('upper resonance frequency') (S506), calculate again the current collecting capacity and the level of EMF whilst increasing resonance frequency among said design parameters in the range below said upper resonance frequency and find maximum resonance frequency in the range satisfying design conditions (S510), and determine the resonance frequency, feeding current value at that time, the number of collector coil turns and other design parameter values as the final design parameters (S507).

If feeding current value and the number of collector coil turns satisfying the conditions at the step S505, the width of current supply and collection core may be increased in a permissible range.

In this drawing, it is unified as the term of the width of current supply and collection core. However, in the following, this term means the width (W) of a core (magnetic pole) perpendicular to the traveling direction of a vehicle, that is transverse direction in looking at the front of the road, for U-shaped and W-shaped current supply device or improved type thereof (see drawing 2) and means the gap (L) between I-shaped cores (magnetic poles) arranged in series in the traveling direction of a vehicle for I-shaped current supply device or improved type thereof (see drawing 3).

That is, increase the value of the width of current supply and collection core, adjust feeding current value and the number of collector coil turns and repeat calculation of current collecting capacity and the level of EMF generated (S508). If the values of the width of current supply and collection core, feeding current value and the number of collector coil turns exist (S509), go to the next step (S506), but if the values do not exist (S509), end the design process.

If the value exists at the step S509, when the present resonance frequency among design parameters is less than the maximum resonance frequency in a permissible range ('upper resonance frequency') (S506), find maximum resonance frequency which satisfies design conditions by increasing resonance frequency among said design parameters in the range below said upper resonance frequency and repeating calculation of current collecting capacity and the level of EMF (S510) and determine the resonance frequency, feeding current value determined in the abovementioned steps, the number of collector coil turns, the width of current supply and collection core and other present design parameter values as the final design parameters (S507).

If more than two core structure types are input at first, this design process can be configured so that it would be automatically performed in regular sequence for each of the core structure type.

It is desirable to set said resonance frequency value higher than maximum audio frequency (20 kHz) so as to reduce noise.

Drawing 6 shows a device (600) for designing a current supply and collection device which supplies and collects electric power magnetic induction.

In order to design a current supply and collection device which satisfies current collecting capacity and the level of EMF in the set range, a design process controlling part (610) controls each of the following components and calculates current collecting capacity and the level of EMF according to the change of each design parameter and controls the process to determine design parameters thereof.

A current collecting capacity calculating part (620) calculates current collecting capacity from design parameters including resonance frequency, feeding current value, the width of current supply and collection core and the number of collector coil turns.

An EMF level calculating part (630) calculates the level of EMF generated using said design parameters.

A gap distance calculating part (640) calculates the gap distance between a current supply device and a current collection device using said design parameters.

A design parameter database (650) saves said design parameter values and variable range value of each of said design parameters.

An input part (660) receives design condition references including each of said design parameter values, variable range value of each of said design parameters, requested current collecting capacity, EMF level, and the minimum gap distance between a current supply device and a current collection device as inputs from the user.

A design screen providing part (670) displays various data of design process including data calculated from the design process, design condition references and design parameter values. The data calculated from the design process, as abovementioned, may include current collecting capacity calculated by the present design parameters, the level of EMF calculated using the present design parameters, and the gap between a current supply device and a current collection device calculated using the present design parameters.

What is claimed is:

1. A computer-implemented method for designing a current supply device including a current supply core or a plurality of magnetic poles for wirelessly supplying power to a vehicle having a current collection device, the method comprising:
   (a) receiving a gap between the current supply device and the current collection device as input;
   (b) determining a width of the current supply core or a gap between two adjacent magnetic poles based on the gap between the current supply device and the current collection device;
   (c) receiving a magnitude of a magnetic field which the current supply device is required to generate as input;
   (d) determining a magnitude of a power to be supplied to the current supply device based on the width of current supply core or the gap between two adjacent magnetic poles determined at the step (b) and the value required with respect to the magnitude of the magnetic field; and
   (e) supplying power to the current supply device with the magnitude determined at the step (d).

2. The computer-implemented method for designing a current supply device as claim 1, further comprising determining mounting structure of feeding line which supplies power to the current supply device (d1) after the step (d).

3. The computer-implemented method for designing a current supply device as claim 1, further comprising receiving an orientation of the magnetic poles of the current supply device as input before the step (a).

4. The computer-implemented method for designing a current supply device as claim 3, wherein for the orientation of the magnetic poles of the current supply device, more than two magnetic poles are arranged in the traveling direction of the vehicle and in a line with each other.

5. The computer-implemented method for designing current supply device as claim 3, wherein for the orientation of the magnetic poles of the current supply device, multiple magnetic poles are arranged in series in the traveling direction of the vehicle.

6. The computer-implemented method for designing a current supply device as claim 1, further comprising determining shield type either active or passive for EMF generated from the current supply device and the current collection device (d2) after said step (d).

7. The computer-implemented method for designing a current supply device as claim 1, further comprising determining on/off conditions of a switch of the current supply device (d3) after said step (d).

8. The computer-implemented method for designing a current supply device as claim 1, further comprising determining resonance of the current collection device mounted in the vehicle at a frequency of AC magnetic field generated from the current supply device (d4) after said step (d).

9. A computer-implemented method for designing a current supply device and a current collection device of a vehicle, wherein the current supply device wirelessly supplying power to the current collection device by generating magnetic field, the method comprising:
   (a) a step where design parameters including resonance frequency, feeding current value, the width of the current supply device and the number of coil turns of the current collection device are set as initial values;
   (b) a step where minimum current collecting capacity required for the current collection device ('current collecting capacity reference') and maximum EMF value allowable from the current supply device and the current collection device ('EMF reference') are received as input;
   (c) a step where current collecting capacity and the level of EMF are calculated using the present design parameters;
   (d) a step where if the calculated current collecting capacity is below said current collecting capacity reference or the level of EMF is above said EMF reference ("design conditions dissatisfied"), calculation of current collecting capacity and the level of EMF is repeated while adjusting feeding current value among the set design parameters; and
   (e) a step where if there is feeding current value which makes the calculated current collecting capacity above said current collecting capacity reference and the level of EMF below said EMF reference ("design conditions satisfied"), such feeding current value and other present design parameter values are determined as the final design parameters; and
   (f) applying the final design parameters to the current supply and collection device.

10. The computer-implemented method for designing a current supply and collection device as claim 9, wherein for said step (e), if there is feeding current value which satisfies design conditions, before determining the present design parameter values as the final design parameters, (e11) a step where if the present resonance frequency is below maximum resonance frequency in a permissible range ('upper resonance frequency), maximum resonance frequency which satisfies design conditions is found by increasing resonance frequency among said design parameters in the range below said upper resonance frequency and repeating calculation of current collecting capacity and the level of EMF is included, and then (e12) a step where the maximum resonance frequency found in said step (e11), the feeding current value of said step (e), and other present design parameter values are determined as the final design parameters is included.

11. The computer-implemented method for designing a current supply and collection device as claim 9, wherein for said step (e), if there is no feeding current value which satisfies design conditions, before determining the present design parameter values as the final design parameters, (e21) a step where calculation of current collecting capacity and the level of EMF is repeated while the width of current supply and collection core or the gap between magnetic poles (commonly called 'the width of current supply and collection core') in a permissible range is increased and feeding current value is adjusted; (e22) a step where if the width of current supply and collection core and feeding current value which satisfy design conditions do not exist, design process for a current supply device ends, and if they exist, the next step (e23) is followed; (e23) a step where if the present resonance frequency is below maximum resonance frequency in a permissible range ('upper resonance frequency'), maximum resonance frequency satisfying design condition is found by increasing resonance frequency among said design parameters in the range below said upper resonance frequency and repeating calculation of current collecting capacity and the level of EMF is included, and then (e24) a step where the maximum resonance frequency found in said step (e23), the feeding current value of said step (e22), and other present design parameter values are determined as the final design parameters is included.

12. The computer-implemented method for designing a current supply and collection device as claim 9, wherein for said step (d), the number of collector coil turns is included in design parameters to be adjusted, and for said step (e), the number of collector coil turns is included in design parameters which are determined as the final design parameters if they exist.

13. The computer-implemented method for designing a current supply and collection device as claim 9, wherein said resonance frequency is set to be higher than maximum audio frequency.

14. The computer-implemented method for designing a current supply and collection device of claim 9, wherein decision of whether design conditions are satisfied includes decision of whether the gap between the current supply device and the current collection device is more than the minimum gap which has already been set.

15. A computer-implemented method for designing a current supply device for wirelessly supplying power to a vehicle having a current collection device by generating magnetic field, the method comprising:
   (a) a step where a core structure type of the current supply device and the current collection device is received as input, of which design parameters including resonance frequency, feeding current value, the width of the current supply device, and the number of coil turns of the current collection device will be determined;
   (b) a step where said design parameters are set to initial values;
   (c) a step where minimum current collecting capacity required for the current collection device (current collecting capacity reference) and maximum EMF allowable from the current supply device and the current collection device are received as input;
   (d) a step where current collecting capacity and the level of EMF are calculated using the present design parameters;
   (e) a step where if the calculated current collecting capacity is below said current collecting capacity reference or the level of EMF is above said EMF reference ("design conditions dissatisfied"), calculation of current collecting capacity and the level of EMF is repeated while feeding current value among the present design parameters is adjusted;
   (f) a step where if there is feeding current value which makes the calculated current collecting capacity above said current collecting capacity reference and the level of EMF below said EMF reference ("design conditions satisfied"), such feeding current value and other present design parameter values are determined as the final design parameters for said core structure type; and (q) applying the final design parameters to the current supply device.

16. The computer-implemented method for designing a current supply and collection device as either claim 15, wherein for said step (a), if more than two core structure types are received as input, said steps (b) through (f) are carried out sequentially for each of the core structure types.

17. The computer-implemented method for designing a current supply and collection device as either claim 15, wherein for said step (f), if there is feeding current value which satisfies design conditions, before determining the present design parameter values as the final design parameters, (f11) a step where if the present resonance frequency is below maximum resonance frequency in a permissible range ('upper resonance frequency'), maximum resonance frequency which satisfies design conditions is found by increasing resonance frequency among said design parameters in the range below said upper resonance frequency and repeating calculation of current collecting capacity and the level of EMF is included, and then (f12) a step where the maximum resonance frequency found in said step (f11), the feeding current value of said step (f), and other present design parameter values are determined as the final design parameters is included.

18. The computer-implemented method for designing a current supply and collection device as either claim 15, wherein for said step (f), if there is no feeding current value which satisfies design conditions, before determining the present design parameter values as the final design parameters, (f21) a step where calculation of current collecting capacity and the level of EMF is repeated while the width of current supply and collection core or the gap between magnetic poles (commonly called 'the width of current supply and collection core) is increased in a permissible range and feeding current value is adjusted; (f22) a step where if the width of current supply and collection core and feeding current value which satisfy design conditions do not exist, design process for a current supply device ends, and if they exist, the next step (f23) is followed; and (f23) a step where if the present resonance frequency is below maximum resonance frequency in a permissible range ('upper resonance frequency'), maximum resonance frequency which satisfies design conditions is found while resonance frequency among said design parameters is increased in the range below said upper resonance frequency and calculation of current collecting capacity and the level of EMF is repeated are included, and then (f24) a step where the maximum resonance frequency found in said step (f23), the feeding current value of said step (f22), and other present design parameter values are determined as the final design parameters is included.

19. The computer-implemented method for designing a current supply and collection device as either claim 15, wherein for said step (e), the number of collector coil turns is included in design parameters to be adjusted, and for said step (f), the number of collector coil turns is included in design parameters which are determined as the final design parameters if they exist.

20. The computer-implemented method for designing a current supply and collection device as claim 15, wherein said resonance frequency is set to be higher than maximum audio frequency.

* * * * *